United States Patent [19]
Hoffman et al.

[11] Patent Number: 5,367,124
[45] Date of Patent: Nov. 22, 1994

[54] COMPLIANT LEAD FOR SURFACE MOUNTING A CHIP PACKAGE TO A SUBSTRATE

[75] Inventors: Herman S. Hoffman; Richard W. Noth, both of Milton, Vt.

[73] Assignee: International Business Machines Corporation, Armonk, N.Y.

[21] Appl. No.: 84,643

[22] Filed: Jun. 28, 1993

[51] Int. Cl.$^5$ ............................................. H01H 9/02
[52] U.S. Cl. .................................. 174/52.4; 257/666; 257/690; 257/696
[58] Field of Search ............... 257/666, 690, 691, 692, 257/693, 694, 695, 696, 697; 174/52.4; 361/813

[56] References Cited

U.S. PATENT DOCUMENTS

| | | |
|---|---|---|
| 3,119,172 | 1/1964 | Mazenko et al. |
| 3,345,622 | 10/1967 | Matsushita . |
| 4,443,409 | 2/1984 | Tsuji et al. . |
| 4,647,126 | 3/1987 | Sobota, Jr. . |
| 4,705,205 | 11/1987 | Allen et al. . |
| 4,722,470 | 2/1988 | Johary . |
| 4,827,611 | 5/1989 | Pai et al. . |
| 5,177,326 | 1/1993 | Goldhammer ........................ 257/693 |

FOREIGN PATENT DOCUMENTS 62-219863 6/1987 Japan .

OTHER PUBLICATIONS

Semiconductor Device, Bonshihara, 61-147560, Japan Jul. 1986.
Lead Modification for solderless attachment of Flat-pack components, Anonymous Sep. 1990.
Kovac, Caroline A., "Plastic Package Fabrication", Electronic Materials Handbook, vol. 1, Packaging ASM, pp. 470-489, 1989.
Murakami et al., "Packaging Technology for Thin, High Density and High Speed Devices", Hitachi Review, vol. 40, No. 1, pp. 51-56, 1991.
Robock et al., "Plastic Packaging", Microelectronics Packaging Handbook, Van Nostrand Reingold, pp. 523-553, 1989.

*Primary Examiner*—Lincoln Donovan
*Attorney, Agent, or Firm*—Heslin & Rothenberg

[57] ABSTRACT

A compliant lead for electromechanically surface mounting an integrated circuit chip package to a substrate. The compliant lead extends from the package and includes at least two regions of different lead thickness. In a first region, a standard lead thickness is employed to ensure the applicability of existing package fabrication techniques. A second region, having a reduced thickness, then extends from the first region and is predefined to encompass an area of the lead expected to undergo greatest stress during thermal cycling. Compliancy is further guaranteed by providing a solder dam within the region of reduced thickness to limit wicking of solder when the package is solder mounted to the substrate. Lead frame fabrication is also discussed.

21 Claims, 3 Drawing Sheets

COMPLIANT LEAD FOR SURFACE MOUNTING A CHIP PACKAGE TO A SUBSTRATE

TECHNICAL FIELD

This invention relates in general to an electromechanical connector for mounting an integrated circuit chip package to a substrate, such as a printed wire board, and more particularly, to a more compliant lead for electromechanical connection of the chip package to the substrate.

BACKGROUND ART

Integrated circuit (IC) chips are typically packaged in plastic encapsulant to provide circuit protection from hostile environments and facilitate chip electrical interconnection to a substrate or printed wire board (PWB). By far the most common plastic package for active IC devices is a molded plastic package. With a few variations, the same basic package assembly process is used to fabricate either pin-in-hole packages (such as dual-in-line packages (DIPs)) or surface mounted components, such as thin small-outline packages (TSOPs).

Construction of a molded plastic package begins with a metal lead frame that is usually made by stamping, although for cases in which fine dimensions are required the lead frame may be made by chemical etching. Stamped lead frames are generally preferred because of a lower fabrication cost. Lead frame thickness is typically 250 $\mu$m (10 mils), but may be as thin as 150 $\mu$m (6 mils) today for higher lead count packages.

The lead frame is the central supporting structure of a chip package to which every other element is attached. Etched or stamped from a thin sheet metal strip into a filigree of narrow fingers that radiate from a center platform, the frame carries the chip throughout the assembly process and is embedded in plastic after molding. Bonded to the lead frame's central platform is a semiconductor chip which, in turn, is electrically connected to the radiating fingers of the frame with fine-diameter wires. This assembly of chip, wires and frame is then covered with a thermoset plastic in an operation called transfer molding. With the body defined in rigid plastic, the leads are trimmed, formed, and plated to finish the package.

Further, due to inherent advantages such as small component size, reduced board area requirements, decreased cost and shorter signal paths, surface mount technology is gaining acceptance in the art for mounting components to substrates. In a typical surface mount manufacturing process, solder paste is placed on conductive pads or regions of a substrate such as a circuit board, using a screen or stencil printing operation. A component is placed on the board with its leads contacting the solder paste and a reflow operation is performed to melt the solder and create a solder bond between each lead and its corresponding conductive region.

In order to minimize stress at the chip attach, it may be desirable to have a lead frame material with a low coefficient of thermal expansion (CTE), for example, close to that of silicon (Si). The materials most commonly used for lead frames in molded packages are copper or nickel-iron alloys.

Unfortunately, surface mounted modules (such as TSOPs) often show early solder joint cracking when subjected to thermal cycle stress. Cracks typically occur at the rigid solder interface joining an outer lead end (or foot) with a wire bonding card. This is attributable to the thermal coefficient of expansion mismatch between the module body, the module lead and the substrate. The problem is compounded in the case of TSOP technology since the leads are short and there is little elastic deformation available to buffer strain experienced by the solder joints.

Thus, a need exists in surface mounting technology for a more compliant lead configuration to reduce resultant solder joint stress due to TCE (particularly in the case of TSOP). The present invention addresses this need.

DISCLOSURE OF INVENTION

Briefly summarized, a first aspect of the invention comprises a compliant lead for electromechanically mounting an integrated circuit chip package to a surface of a substrate, such as a PWB. The compliant lead includes a finger of conductive material having a length with at least two regions of different thickness. A first region of the finger has a uniform thickness 't' located adjacent to the chip package when the compliant lead electromechanically connects the chip package to the substrate. A second region of the finger has a substantially uniform, reduced thickness '$t_r$'. wherein '$t_r$'<'t'. This second region of reduced thickness is located so as to improve lead compliancy during thermal cycling when the compliant lead electromechanically connects the chip package to the substrate. Various enhancements to the basic structure are also presented.

In another aspect, this invention comprises a compliant lead extending from an integrated circuit chip package for electrically and mechanically mounting the chip package to a surface of a substrate via soldering. The compliant lead includes a finger of conductive material having a length with at least two regions of different thickness. A first region of the finger has a uniform thickness 't' and a second region of the finger has a uniform, reduced thickness '$t_r$', wherein '$t_r$'<'t'. The region of reduced thickness is disposed so as improve compliancy of the finger when it is exposed to thermal stress. A non-metallic substance is affixed to the finger and located to function as a solder dam to limit wicking of solder along the finger when the finger is being soldered to the surface of the substrate for electromechanical mounting of the integrated circuit chip package to the surface of the substrate.

In still another aspect, a method for fabricating an integrated circuit chip package with compliant leads extending therefrom for electrically and mechanically mounting the chip package to a surface of a substrate is provided. This fabricating method includes: fabricating a lead frame of substantially uniform thickness in strip form with a platform and multiple fingers extending outward therefrom, the platform being sized to reside within the integrated circuit chip package once fabricated, at least some of the fingers extending from the platform being interconnected so as to form a dam bar site; forming a region of reduced thickness within each of the fingers extending from the platform, the regions of reduced thickness being disposed within said fingers outwardly from the dam bar site; attaching the lead frame to an integrated circuit chip; encapsulating the lead frame and integrated circuit chip such that the fingers form leads extending from the encapsulant and having the regions of reduced thickness formed therein; and removing the finger interconnections comprising part of the dam bar site such that multiple discrete leads extend from the encapsulant.

To restate, a novel lead structure and fabrication approach are described which extend the thermal fatigue life of surface mounted integrated circuit chip packages, such as TSOP modules. Increased compliancy is attained by selective reduction in the thickness of the lead within a region anticipated to experience high stress due to thermal coefficient of expansion mismatches between the module body, lead and substrate. This improvement in compliancy is attained without significantly altering existing package manufacturing techniques. The region of reduced thickness is predefined in order to not interfere with the dam bar site employed in today's transfer molding operation. As another aspect, a solder dam is employed to protect against wicking of solder during surface mounting of the package to the substrate, particularly in the region of reduced lead thickness. Existing tape application machines can be configured to apply an appropriate solder dam.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIGS. 5a–5f depict selected steps in a compliant lead fabrication process pursuant to the present invention, beginning with a lead frame structure such as that depicted in FIG. 5a.

BEST MODE FOR CARRYING OUT THE INVENTION

Refer now to the drawings wherein the same reference numbers used throughout multiple figures designate the same or similar components.

Figure 1:
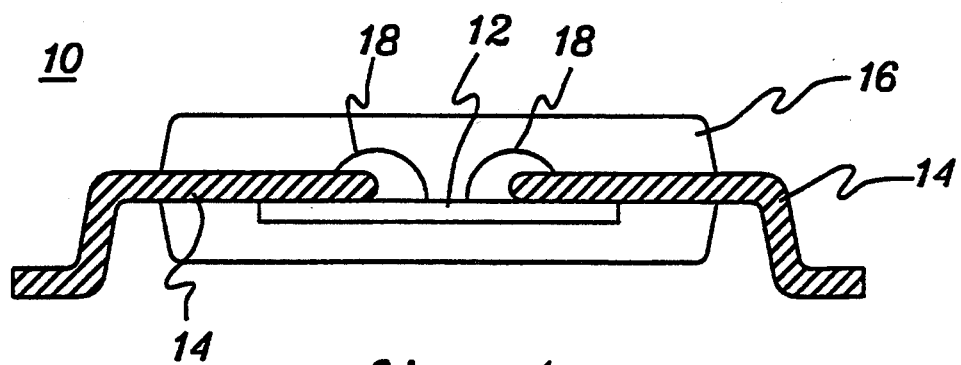
FIG. 1 is a cross-sectional elevational view of a conventional integrated circuit chip package.

By way of overview, FIG. 1 depicts a conventional integrated circuit chip package, generally denoted 10. Chip package 10 comprises a molded module having a chip 12, a metal lead frame 14, a molding compound 16 and lead frame to chip interconnect wires 18, which are typically fine-diameter gold wire. Lead frame 18 is a central supporting structure of package 10 around which every other element is attached. After body 16 is formed, all outwardly extending leads are trimmed, and plated to finish the package. The outwardly extending portions of lead frame 14 are shaped in a form referred to as "gull-wing" due to their curved configuration. In one specific implementation, package 10 may comprise a thin small-outline package (TSOP). TSOP devices are typically used today for logic and memory circuitry.

Figure 2:
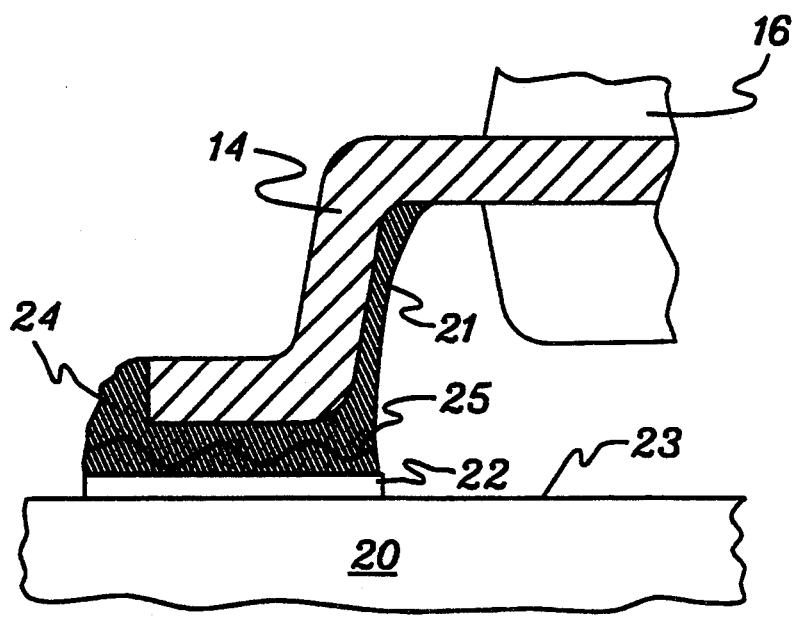
FIG. 2 is an expanded partial view of an integrated circuit chip package with a conventional electromechanical surface mount to a wire bonding card.

In FIG. 2, integrated circuit chip package 10 is shown surface mounted to a pad 22 on an upper surface 23 of a substrate 20 (such as a printed wire board (PWB)). Surface mounting is via a solder joint 24 formed by employing any one of numerous solder bonding techniques known in the art. As shown, wicking 21 of solder 24 occurs along an underside (i.e., package-facing side) of lead 14. When subjected to thermal cycle stress, a solder joint crack 25 can occur. Cracking typically occurs as shown at the point where the outermost end of a lead (i.e., the lead foot) connects with pad 22 of substrate 20. When cracking occurs it is attributable most often to a thermal coefficient of expansion (TCE) mismatch between body 16 of package 10, lead 14 and substrate 20. The wicking of solder 21 along the underside of lead 14 further reduces the compliance of lead 14 and increases the likelihood of solder joint cracking during thermal stress. In the case of a TSOP device, leads are very short such that there is little elastic deformation available within the lead to buffer any strain to mechanical joints due to thermal stress.

The following embodiments of the invention present a lead structure and lead fabrication process which provide greater pin compliancy than otherwise available with existing lead structures.

Figure 3:
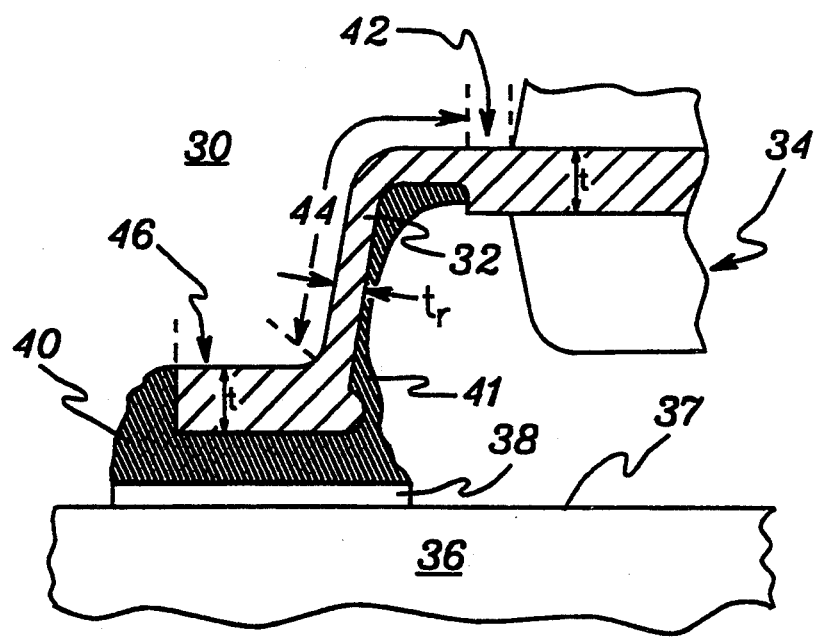
FIG. 3 is an expanded partial view of one embodiment of an integrated circuit chip package with an electromechanical surface mount to a substrate via a compliant lead pursuant to the present invention.

One embodiment of an integrated circuit chip package, generally denoted 30, pursuant to the invention is shown in FIG. 3. Package 30, surface mounted to a substrate 36, includes a lead frame 32 which extends from within package encapsulant 34 to make electromechanical surface connection to an upper surface 37 of substrate 36, for example, via a connection pad 38 and solder 40. As shown, a portion of solder 40 has wicked 41 along the underside of compliant lead 32.

Compliant lead 32 includes at least two regions of different thickness. In a first region 42 the thickness 't' of compliant lead 32 is assumed, by way of example, to be that of a conventional lead extending from a TSOP device. For example, somewhere in the range of 6–10 mils is common. As discussed further herein, first region 42 extends out from encapsulant 34 a sufficient distance so that an appropriate dam bar site is provided for transfer molding of the package.

A second region 44 of compliant lead 32 continues from first region 42 outward from the molded package. Region 44 encompasses that portion of lead 32 comprising a critical area where the greatest stress is placed on surface mounted lead 32 during thermal cycling. (Those skilled in the art will recognize how to locate this area of greatest stress for different lead configurations.) Within second region 44 the thickness $t_r$ of compliant lead 32 is reduced relative to the "standard" lead thickness 't' employed in first region 42. By way of example, thickness $t_r$ of second region 44 can be nominally one-half the lead thickness 't' of first region 42. Such a selective reduction in lead thickness can be produced by any number of available (metal) thickness reducing techniques, such as coining or etching within predefined region 44.

In the embodiment depicted, lead 32 has been processed such that conductive material is removed from the underside (or inner-facing side) of lead 32. As an alternative, material could be removed from the upperside of lead 32 or removed from both the upperside and underside in any desired ratio. Further, the length of the second region relative to the length of the outwardly extending lead may be shorter or longer as required for a particular implementation. The area of reduced thickness should, however, cover the critical area where the greatest stress on the lead is expected to occur when the lead is affixed to the substrate. With a typical lead thickness 't' of 6–10 mils, the area of reduced thickness 't,' may be approximately 3–5 mils. An even thinner thickness may be available depending upon the removal operation employed.

Note it is significant that there are at least two regions of different thickness pursuant to this aspect of the invention, with one of the regions having a standard thickness based on manufacturing process considerations. (If first region 42 is fabricated to have the same reduced lead thickness as second region 44, then in all likelihood, the dam bar function of the lead frame would be usurped and the lead frame would be of questionable value in connection with existing molding techniques. Also, if coining is chosen to reduce the thickness of lead 32, then control must be maintained to ensure that the resultant expanded width of each lead within region 44 does not short to an adjacent lead.)

In the embodiment of FIG. 3, the area of reduced thickness 't,' terminates near a "foot" 46 or outermost end of lead 32. Foot 46, comprising a third region of lead 32, has a thickness 't' substantially equal to the thickness 't' of first region 42. Again, those skilled in the art will recognize that the area of greatest stress on lead 32 during thermal cycling occurs within second region 44, notwithstanding that any resultant crack (not shown) would ultimately develop in the rigid solder 40 below foot 46 of lead 32. With increased lead 32 compliance within second region 44, lead 32 will tend to give during thermal cycling, thereby reducing the transfer of stress to solder 40 below foot 46.

Figure 4:
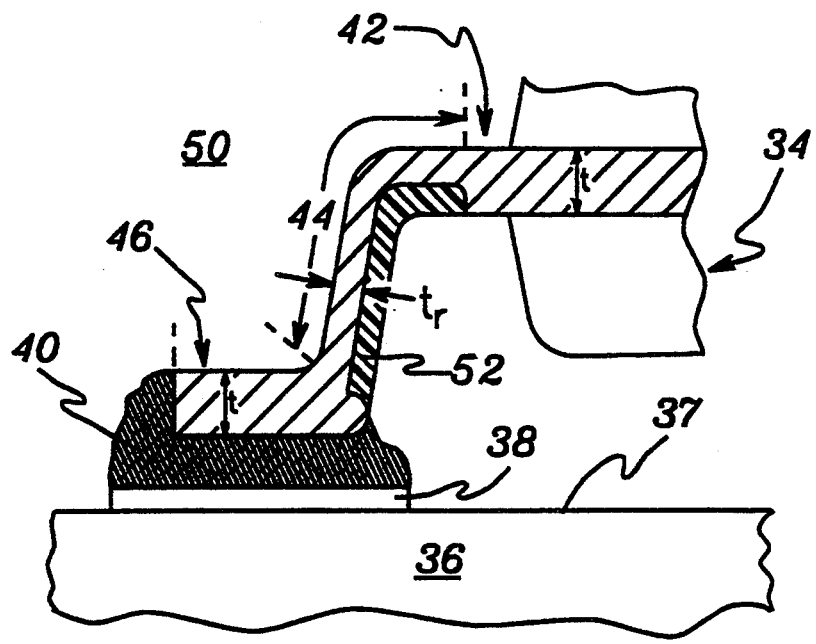
FIG. 4 is an expanded partial view of an integrated circuit chip package with an electromechanical surface mount to a substrate via another embodiment of a compliant lead pursuant to the present invention.

Lead 32 conventionally comprises copper or a copper alloy such that wetting of solder 40 along the underside of lead 32 may occur. If wetting occurs, the resultant solder 41 tends to reduce lead compliance in the area of selectively reduced thickness 44. Thus, pursuant to another aspect of the invention, a solder dam is employed near the interface of foot 46 and region 44. FIG. 4 depicts one embodiment of such a solder dam, generally denoted 52, disposed on the underside of the compliant lead. The integrated circuit chip package, denoted 50, of FIG. 4 and its fabrication approach are assumed to be similar to those described above with respect to FIG. 3, except solder dam 52 is now added to the underside of second region 44 prior to soldering of the lead to substrate 36. Solder dam 52 can comprise any non-metallic flexible material and need not necessarily extend for the entire length of second region 44. For example, a strip of material adjacent to the interface of regions 44 & 46 may be sufficient to function as a solder dam. In the embodiment depicted, solder dam 52 comprises a tape.

Tape 52 can be applied using any existing tape application machine. Tape is appropriately punched (or formed) and the apply machine places the tape within the selected region, i.e., second region 44. Taping of certain portions of a lead frame is common in the industry to improve rigidly of the frame for handling during the fabrication process, subsequent to which the tape is removed. Pursuant to the invention, however, the tape remains in position as placed to operate as a solder dam during the electromechanical connection of the package (such as package 50) to the substrate. Again, tape 52 can comprise any non-metallic flexible material and need not necessarily extend for the entire length of second region 44. The desired function of tape 52 is to act as a solder dam near the solder point of the lead. Sufficient material to accomplish this object is therefore needed. Further, although shown with respect to a gull-wing configuration, the concepts of the present invention readily apply to other known surface mount lead implementations.

Figure 5A:
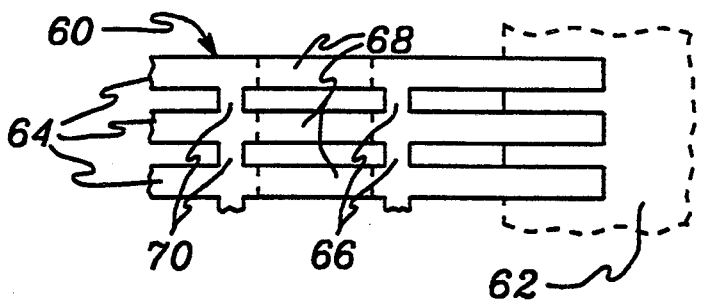

One partial embodiment of a lead frame, denoted 60, is shown in plan view in FIG. 5a. Lead frame 60 is to be secured to an integrated circuit chip (shown in phantom). As shown, spacing between adjacent fingers 64 is at this point substantially the same, with a first cross member 66 being separated from a second cross member 70 by a region of material 68, which is ultimately to comprise the (prelocated) region of reduced lead thickness. One package fabrication process pursuant to the invention using lead frame 60 is explained below with reference to FIGS. 5b–5f.

Figure 5B:
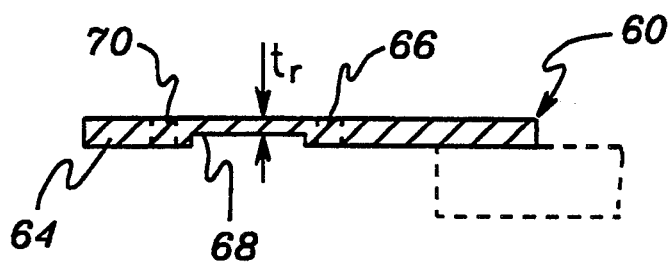

In FIG. 5b, lead frame 60 of FIG. 5a is shown in side elevational view with placement of the integrated circuit chip still shown in phantom. Each finger of lead frame 60 has a region of reduced thickness 't,' 68 formed therein, for example, by coining or etching of the lead frame. Cross member 66 and 70 are still positioned to interconnect the outwardly extending fingers of the lead frame. Since cross member 66 operates as a dam bar site during encapsulation processing (discussed below), the region 68 of reduced thickness 't,' is formed relative to member 66 in a direction outward from the package yet to be molded.

Figure 5C:
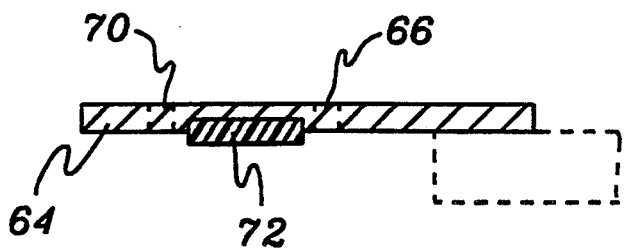

Referring to FIG. 5c, after forming the region of reduced thickness 68, tape 72 is applied within the thinned regions. (Again, the construction and thickness of tape 72 should be such so as to provide a (flexible) solder dam against the wicking of solder along the underside of the lead when the package is surface mounted to a substrate.) Existing tape application machines can be employed to affix solder dam 72 to the lead.

Figure 5D:
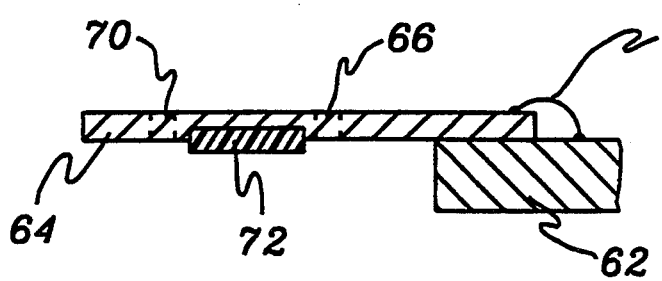
Figure 5E:
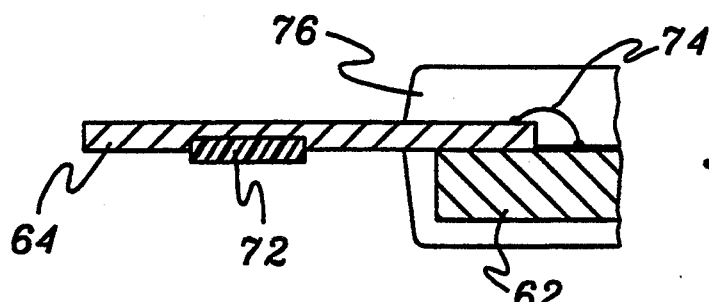
Figure 5F:
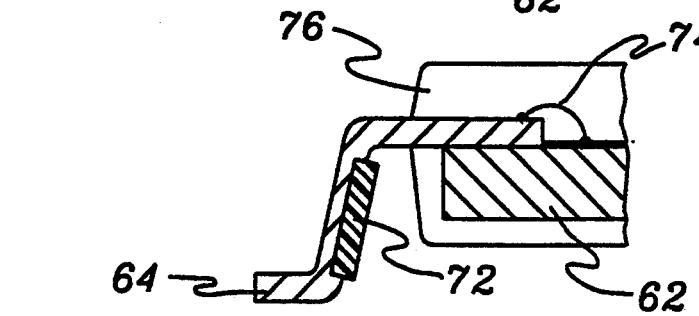

Next, the lead frame is attached to chip 62 and wire bonded 74 (FIG. 5d). Thereafter, molding occurs such that encapsulant 76 surrounds chip 62 and wire bond 74 (FIG. 5e). The dam bar site 66 is then removed, along with any additional lead frame supporting interconnections, such as cross member 70. Finally, the leads are trimmed and formed of the desired configuration, e.g., the gull-wing structure depicted in FIG. 5f.

Those skilled in the art will recognize from the above description that a novel lead structure and fabrication approach are presented which extend the thermal fatigue life of surface mounted integrated circuit chip packages (such as TSOPs). Increased compliancy is attained by selective reduction in the thickness of the lead within a region anticipated to experience high stress due to thermal coefficient of expansion mismatches between the module body, lead and substrate. This improvement in compliancy is attained without significantly altering existing package manufacturing techniques. The region of reduced thickness is prelocated in order to not interfere with the dam bar site typically employed in a transfer molding operation. As another aspect, a flexible solder dam is used to protect against wicking of solder into the region of reduced thickness during surface mounting of the package to the substrate. Existing tape application machines could be employed to apply the solder dam within the regions of reduced lead thickness.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A compliant lead for electrically and mechanically mounting an integrated circuit chip package to a surface of a substrate, said compliant lead comprising:
   a finger of conductive material having a length with at least two regions of different thickness along said length;
   a first region of said finger of conductive material having a uniform thickness 't', said first region of uniform thickness being disposed so as to be located adjacent to the integrated circuit chip package when said compliant lead electrically and mechanically connects the integrated circuit chip package to said surface of the substrate; and
   a second region of said finger of conductive material having a substantially uniform, reduced thickness '$t_r$', wherein '$t_r$'<'t', said second region of reduced thickness being located so as to improve lead compliancy during thermal cycling when said compliant lead electrically and mechanically connects the integrated circuit chip package to said surface of the substrate.

2. The compliant lead of claim 1, wherein said finger having at least two regions of different thickness along said length includes a third region, said third region of said finger of conductive material having said substantially uniform thickness 't' and being located so as to be adjacent to said surface of the substrate when said compliant lead electrically and mechanically connects the integrated circuit chip package to said surface of the substrate, and wherein said second region of reduced thickness '$t_r$' is disposed between said first region of uniform thickness 't' and said third region of uniform thickness 't'.

3. The compliant lead of claim 2, wherein said third region of said finger of conductive material having said substantially uniform thickness 't' comprises a foot of said compliant lead, said foot being configured to facilitate mounting of said integrated circuit chip package to said surface of the substrate.

4. The compliant lead of claim 1, wherein said reduced thickness '$t_r$' of said second region of said finger of conductive material is approximately one-half said uniform thickness 't' of said first region of said finger of conductive material.

5. The compliant lead of claim 4, wherein said uniform thickness 't' of said first region of said finger of conductive material is in the range of 6–10 mils.

6. The compliant lead of claim 1, wherein said lead is fabricated from copper or nickel-iron alloy, and wherein said integrated circuit chip package includes a plastic encapsulant, and said surface of said substrate comprises plastic such that a coefficient of thermal mismatch exists between said integrated circuit chip package, said compliant lead and said substrate.

7. The compliant lead of claim 6, wherein said integrated circuit chip package comprises a thin small-outline package.

8. The compliant lead of claim 1, wherein said finger of conductive material is curved in a gull-wing configuration.

9. The compliant lead of claim 1, further comprising a non-metallic substance secured to said finger within said second region of substantially uniform, reduced thickness '$t_r$' such that when said compliant lead undergoes soldering to electrically and mechanically connect the integrated circuit chip package to the surface of the substrate, said nonconductive substance functions as a solder dam to limit wicking of solder along said finger of conductive material.

10. The compliant lead of claim 9, wherein said non-metallic substance comprises a non-metallic tape affixed to said finger within said second region having said substantially uniform, reduced thickness '$t_r$' of conductive material.

11. The compliant lead of claim 10, wherein said non-metallic tape extends substantially entirely within said second region of said finger of conductive material having said substantially uniform, reduced thickness '$t_r$'.

12. A lead frame for electrically and mechanically connecting an integrated circuit chip package to a substrate, said lead frame forming part of said integrated circuit chip package, said lead frame comprising:
   a platform of conductive material having multiple fingers radiating therefrom, each of said fingers having substantially a same length with at least two regions of different thickness disposed along said length;
   a first region of each finger having a uniform thickness 't', each first region of uniform thickness being disposed so as to be located adjacent to the integrated circuit Chip package when said lead frame electrically and mechanically connects the integrated circuit chip package to the substrate; and
   a second region of each finger having a substantially uniform, reduced thickness '$t_r$', wherein '$t_r$'<'t' each second region of reduced thickness being located so as to improve finger compliancy during thermal cycling when said lead frame electrically and mechanically connects the integrated circuit chip package to the substrate.

13. The lead frame of claim 12, wherein each of said second regions of reduced thickness '$t_r$' is at least partially filled with a non-metallic material designed to minimize solder wicking along said finger when solder is employed to connect said finger to the substrate.

14. The lead frame of claim 13, wherein said non-metallic material comprises a non-metallic tape affixed to each finger within said second region so as to extend substantially entirely within said second region of said finger.

15. The lead frame of claim 13, wherein said reduced thickness '$t_r$' of said second region of each finger is approximately one-half said uniform thickness 't' of said first region of each finger.

16. A compliant lead extending from an integrated circuit chip package for electrically and mechanically mounting said chip package to a surface of a substrate via a solder connection, said compliant lead comprising:
   a finger of conductive material having a length with at least two regions of different thickness along said length;
   a first region of said finger of conductive material having a uniform thickness 't' and a second region of said finger of conductive material having a substantially uniform, reduced thickness '$t_r$', wherein '$t_r$'<'t', said region of reduced thickness being disposed so as to improve compliancy of said finger when exposed to thermal stress; and a non-metallic substance affixed to said finger and located so as to provide a solder dam to limit wicking of solder along said finger when said finger is soldered to the surface of the substrate to provide electrical and mechanical mounting of the integrated circuit chip package to said surface of the substrate.

17. The compliant lead of claim 16, wherein said reduced thickness 't$_r$' of said second region is approximately one-half said uniform thickness 't' of said first region of said finger.

18. The compliant lead of claim 16, wherein said non-metallic substance comprises a non-metallic tape affixed to said finger within said second region.

19. A method for fabricating an integrated circuit chip package with compliant leads extending therefrom for electrically and mechanically mounting said chip package to a surface of a substrate, said fabricating method comprising the steps of:

(a) fabricating a lead frame of substantially uniform thickness in strip form with a platform and multiple fingers extending outward therefrom, said platform being sized to reside within the integrated circuit chip package once fabricated, at least some of said fingers extending from said platform being interconnected so as to form a dam bar site;

(b) forming a region of reduced thickness within each of said fingers extending from said platform, said regions of reduced thickness being disposed outwardly from said dam bar site;

(c) attaching said lead frame to an integrated circuit chip;

(d) encapsulating said lead frame and integrated circuit chip, said fingers forming leads extending from said encapsulant with said regions of reduced thickness formed in said step (b); and (e) removing all finger interconnects comprising part of said dam bar site such that multiple discrete leads exist extending from said encapsulant.

20. The fabricating method of claim 19, further comprising the step of providing a non-metallic substance within the region of reduced thickness formed in each of said fingers in said step (b), said non-metallic substances being positioned within said fingers so as form solder dams when outermost ends of said fingers are electromechanically soldered to said surface of the substrate.

21. The fabricating method of claim 20, wherein said providing of said non-metallic substance includes providing a non-metallic tape encompassing substantially each entire region of reduced thickness within said fingers.

* * * * *